United States Patent
Liu et al.

(10) Patent No.: US 9,929,230 B2
(45) Date of Patent: Mar. 27, 2018

(54) AIR-CORE INDUCTORS AND TRANSFORMERS

(71) Applicant: International Business Machines Corporation, Armonk, NY (US)

(72) Inventors: Yang Liu, Wappingers Falls, NY (US); Naigang Wang, Ossining, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/067,803

(22) Filed: Mar. 11, 2016

(65) Prior Publication Data

US 2017/0263692 A1 Sep. 14, 2017

(51) Int. Cl.
H01L 49/02 (2006.01)
H01L 21/3205 (2006.01)
H01L 21/683 (2006.01)
H01L 21/768 (2006.01)
H01L 23/367 (2006.01)

(52) U.S. Cl.
CPC ........ *H01L 28/10* (2013.01); *H01L 21/32051* (2013.01); *H01L 21/6835* (2013.01); *H01L 21/76898* (2013.01); *H01L 23/3675* (2013.01); *H01L 2221/68318* (2013.01); *H01L 2221/68372* (2013.01)

(58) Field of Classification Search
CPC ....... H01L 2924/00; H01L 2224/48091; H01L 2924/01322; H01L 2924/01327; H01L 2924/12032; H01L 2924/12041; H01L 2924/12042; H01L 2924/15747; H01L 2924/15787; H01L 2924/181; H01L 2924/351

USPC ...................... 257/528, 48, 531; 438/11, 125
See application file for complete search history.

(56) References Cited

U.S. PATENT DOCUMENTS

| | | | | |
|---|---|---|---|---|
| 5,717,243 A | * | 2/1998 | Lowther | H01F 17/0006 257/528 |
| 6,008,126 A | * | 12/1999 | Leedy | G03F 7/70658 257/E21.545 |
| 7,351,644 B2 | | 4/2008 | Henley | |
| 7,994,877 B1 | * | 8/2011 | Kubena | H03H 9/0542 333/185 |

(Continued)

OTHER PUBLICATIONS

C. D. Meyer et al., "Influence of layer thickness on the performance of stacked thick-film copper air-core power inductors," IEEE Transactions on Magnetics, vol. 48, No. 11, 2012, pp. 4436-4439.

(Continued)

*Primary Examiner* — William F Kraig
*Assistant Examiner* — Edward Chin
(74) *Attorney, Agent, or Firm* — Cantor Colburn LLP; Louis Percello

(57) ABSTRACT

According to an embodiment of the present invention, a method for forming a coil comprises patterning a first mask on a handle wafer, and depositing a conductive material on exposed portions of the handle wafer to partially define the coil. A second mask is patterned on portions of the first mask and the conductive material. A solder material is deposited on a portion of the conductive material to partially define a support member. The solder material is bonded to a wafer, and the handle wafer is separated from the conductive material.

17 Claims, 19 Drawing Sheets

(56) References Cited

U.S. PATENT DOCUMENTS

| | | | |
|---|---|---|---|
| 8,736,066 | B2 | 5/2014 | Oganesian et al. |
| 9,070,586 | B1 * | 6/2015 | Dang ............... H01L 24/11 |
| 2013/0333820 | A1 | 12/2013 | Sherrer |
| 2014/0036461 | A1 * | 2/2014 | Palaniswamy ........ H01L 33/486 |
| | | | 361/762 |
| 2014/0240944 | A1 * | 8/2014 | Stenson ................ H01L 28/00 |
| | | | 361/781 |
| 2014/0342529 | A1 | 11/2014 | Goktepeli et al. |
| 2015/0179505 | A1 | 6/2015 | Stuber et al. |
| 2015/0206809 | A1 * | 7/2015 | Ding ..................... H01L 22/26 |
| | | | 438/11 |
| 2016/0276319 | A1 * | 9/2016 | Palaniswamy ...... H01L 25/0753 |

OTHER PUBLICATIONS

K. Chong et al., "High-performance inductors integrated on porous silicon," IEEE Electron Device Letters, vol. 26, No. 2, 2005, pp. 93-95.

L. Gu et al., "Concave-suspended high-Q solenoid inductors with an RFIC-compatible bulk-micromachining technology," IEEE Transactions on Electron Devices, vol. 54, No. 4, 2007, pp. 882-885.

L. H. Guo et al., "High-performance inductors on plastic substrate," IEEE Electron Device Letters, vol. 26, No. 9, 2005, pp. 619-621.

W. C. Lai et al., "300mm size ultra-thin glass interposer technology and high-Q embedded helical inductor (EHI) for mobile application," IEEE International Electron Devices Meeting, 2013, 13.4, 4 pages.

* cited by examiner

AIR-CORE INDUCTORS AND TRANSFORMERS

BACKGROUND

The present invention generally relates to integrated electronic devices, and more specifically, to inductors and transformers formed on a wafer.

An inductor is an electrical component that usually comprises a coiled conductor or wire. In operation, current flows through an inductor; when the current flow changes, a time-varying magnetic field is induced that, in turn, induces a voltage in the conductor.

A transformer is an electrical component that uses induction to transfer electrical energy between circuits. A transformer often includes a set of conductive coils or windings. In operation, when a time-varying magnetic flux is induced in one of the windings, the magnetic flux is induced in the other winding, which results in a time-varying voltage in the other winding. Transformers are often used to increase or decrease alternating current (AC) voltages, and may also be used to transmit power between devices using induction.

As electronic devices continue to decrease in size, it becomes more desirable to integrate electronic components such as inductors and transformers into integrated circuit wafers and chips.

SUMMARY

According to an embodiment of the present invention, a method for forming a coil comprises patterning a first mask on a handle wafer and depositing a conductive material on exposed portions of the handle wafer to partially define the coil. A second mask is patterned on portions of the first mask and the conductive material. A solder material is deposited on a portion of the conductive material to partially define a support member. The solder material is bonded to a wafer, and the handle wafer is separated from the conductive material.

According to another embodiment of the present invention, a method for forming a coil comprises forming a release layer on a handle wafer, and patterning a first mask on the handle wafer. A first layer of conductive material is deposited on exposed portions of the release layer to partially define the coil. A second mask is patterned on portions of the first mask and the first layer of conductive material. A support member is formed on the first layer of conductive material, and the handle wafer is separated from the first layer of conductive material.

According to yet another embodiment of the present invention, a coil device comprises a first wafer and a support member arranged on the first wafer. A coil portion is arranged on the support member. The device includes a first gap region between the coil portion and the first wafer. The first gap region is partially defined by the coil portion and the first wafer.

BRIEF DESCRIPTION OF THE DRAWINGS

FIGS. 1A-11 illustrate an exemplary method for fabricating a coil arranged on support members on a substrate.

FIG. 1A illustrates a cut-away view along the line A-A (of FIG. 1B) of a handle wafer and a release layer arranged on the handle wafer.

FIG. 2 illustrates a side view following the formation of a first mask on portions of the release layer.

FIG. 3 illustrates a side view following the deposition of a conductive material over exposed portions of the release layer and in the cavities (of FIG. 2).

FIG. 4 illustrates a side view following the formation of a second mask over portions of the first mask and the conductive material.

FIG. 5 illustrates a side view following the formation of a third layer of conductive material over exposed portions of the coil member.

FIG. 6 illustrates a side view of the resultant structure following the deposition of a solder material on exposed portions of the third layer of conductive material.

FIG. 7 illustrates a side view following the removal of the first mask and the second mask (of FIG. 6).

FIG. 8 illustrates a side view following a bonding process that bonds the solder material to a semiconductor substrate wafer.

FIG. 9 illustrates a side view following the removal of the handle wafer and the release layer from the coil member.

FIG. 10 illustrates a perspective view of the resultant structure following the removal of the handle wafer as described above.

FIG. 11 illustrates a cut-away view along the line A-A (of FIG. 10) of the inductor.

FIG. 12 illustrates a cut-away view of a portion of a coil member arranged on support members on a wafer.

FIG. 13 illustrates a cut-away view following a suitable solder transfer process is used to transfer the solder from the second handle substrate (of FIG. 12) to the wafer.

FIG. 14 illustrates a cut-away view following a suitable bonding process that bonds the wafer to a second substrate via the solder.

FIG. 15 illustrates a cut-away view of a handle wafer that has a coil member and solder material formed on the handle wafer.

FIG. 16 illustrates a cut-away view following the transfer of the coil member, the solder material, and the solder to the wafer.

FIG. 17 illustrates a cut-away view following a thermal process that reflows the solder FIG. 18 illustrates a cut-away view following a suitable bonding process that bonds the wafer to a second substrate via the solder.

FIG. 19 illustrates a cut-away view of a second substrate and a wafer arranged on the second substrate.

FIG. 20 illustrates a cut-away view of the handle wafer with the coil arranged on the handle wafer.

FIG. 21 illustrates a cut-away view following the removal of the handle wafer (of FIG. 20).

FIG. 22 illustrates a cut-away view of the wafer that includes conductive vias that pass through cavities in the wafer.

FIG. 23 illustrates a cut-away view prior to bonding the wafer to the second substrate using solder that is arranged on the second substrate.

FIG. 24 illustrates a cut-away view following the bonding of the wafer to the substrate.

FIG. 25 illustrates a cut-away view of a second substrate and a wafer arranged on the second substrate.

FIG. 26 illustrates a cut-away view of the wafer with the coil arranged on the wafer.

FIG. 27 illustrates a cut-away view of the wafer with the coil arranged on the wafer and a second wafer arranged on the wafer.

FIG. 28 illustrates a cut-away view of the second substrate, the wafer arranged on the second substrate, the coil arranged on the wafer, and the second wafer arranged on the wafer.

FIG. 29 illustrates a cut-away view of the wafer with the coil arranged on the wafer.

FIG. 30 illustrates a cut-away view of the wafer with the coil arranged on the wafer and a second wafer arranged on the wafer.

FIG. 31 illustrates a cut-away view after the wafer is bonded to the second substrate.

FIG. 32 illustrates a cut-away view of the second substrate, the wafer arranged on the second substrate, the coil arranged on the wafer, and the second wafer arranged on the wafer.

DETAILED DESCRIPTION

The illustrated embodiments described herein provide methods and structures involving inductors and transformers formed on chips. Previous methods for forming inductors or transformers on chips included forming cavities having a particular pattern in a substrate. The cavities were filled with conductive material to form an inductor or transformer device. Previous methods used thick layers of conductive materials that are costly and consumed space on the substrate.

The methods and resultant structures described herein include inductors and transformers that have an airgap or gap between the substrate and the conductive portions of the inductor and transformer devices. Such an arrangement reduces the materials used in forming the devices, and provides a desirable gap that reduces the footprint of the devices on the substrate.

FIGS. 1A-11 illustrate an exemplary method for fabricating a coil arranged on support members on a substrate.

Figure 1A:
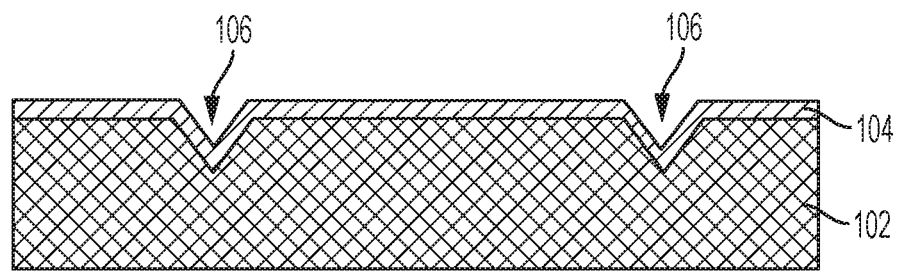

FIG. 1A illustrates a cut-away view along the line A-A (of FIG. 1B) of a handle wafer 102 and a release layer 104 arranged on the handle wafer 102. The handle wafer 102 has been patterned using, for example, a photolithographic patterning and etching process that forms cavities 106 in the surface of the handle wafer 102. The release layer 104 is deposited conformally in the cavities 106 and over the exposed surface of the handle wafer 102.

The release layer has low adhesion properties that reduces the adhesion of materials that are deposited on the release layer 104 in subsequent processes described below. Suitable materials for the release layer 104 may include, for example, stainless steel, titanium, chromium, tungsten, molybdenum, alloy or multilayer stacked materials, or any combination of those materials deposited by, for example, physical vapor deposition, chemical vapor deposition, atomic layer deposition, or plating.

Figure 1B:
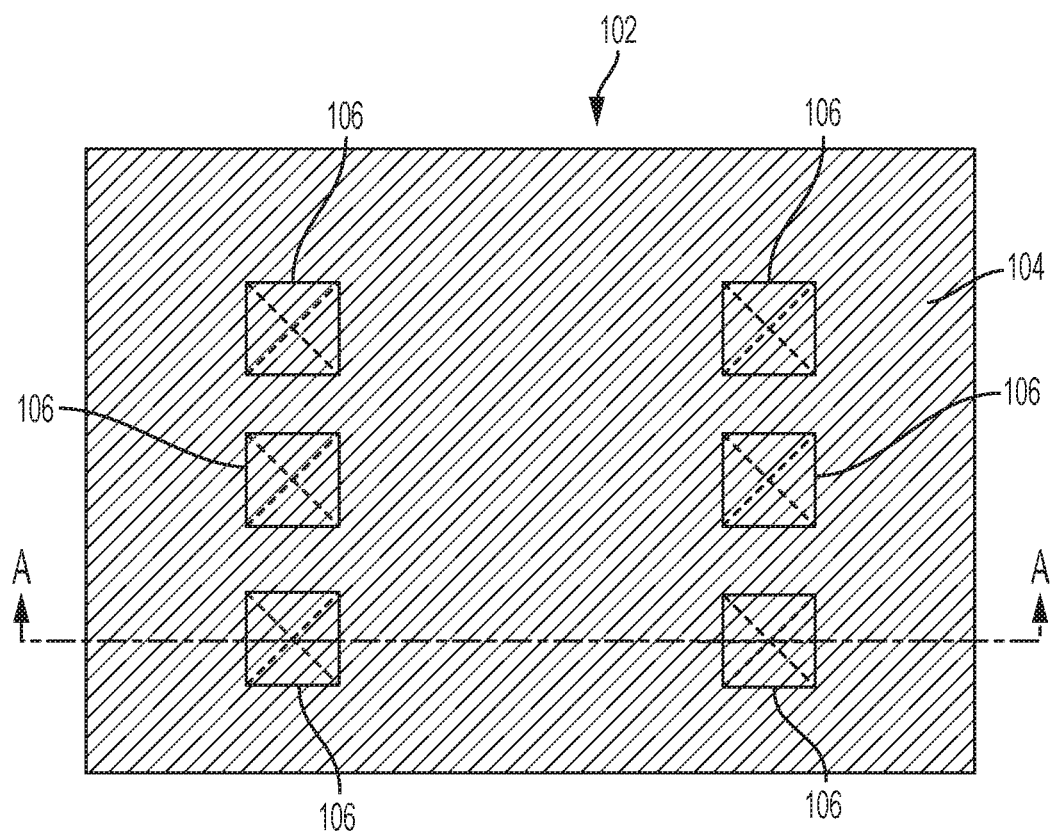
FIG. 1B illustrates a top view of the release layer arranged on the handle substrate (of FIG. 1A) and the cavities.

FIG. 1B illustrates a top view of the release layer 104 arranged on the handle substrate 102 (of FIG. 1A) and the cavities 106. The cavities 106 in the illustrated embodiment are substantially pyramidal shaped, however alternate exemplary embodiments may include cavities 106 that have different shapes.

Figure 2:
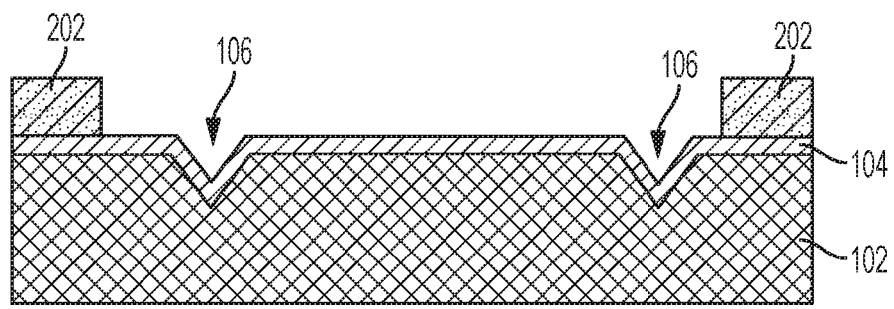

FIG. 2 illustrates a side view following the formation of a first mask 202 on portions of the release layer 104. Suitable resist masks include photoresists, electron-beam resists, ion-beam resists, X-ray resists, and etch resists. The resist may be a polymeric spin on material, laminate or a polymeric material.

Figure 3:
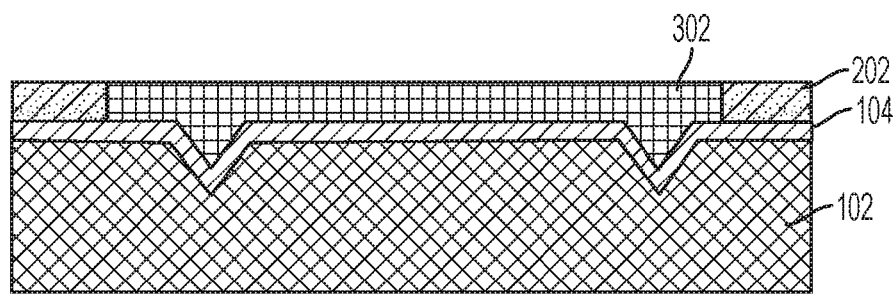

FIG. 3 illustrates a side view following the deposition of a conductive material 302 over exposed portions of the release layer 104 and in the cavities 106 (of FIG. 2). The conductive material 302 may include any suitable conductive material including, for example, a metallic material such as, copper, gold, aluminum, silver, or various other conductive compounds. The conductive material 302 may be formed, by for example, a spin-on, plating, physical or chemical vapor deposition or atomic layer deposition process. The cavities 106 are operative to provide additional surface areas and regions that encourage the conductive material 302 deposition process on the release layer 104. In other words, the cavities 106 improve the deposition process of the conductive material 302 on the release layer 104.

Figure 4:
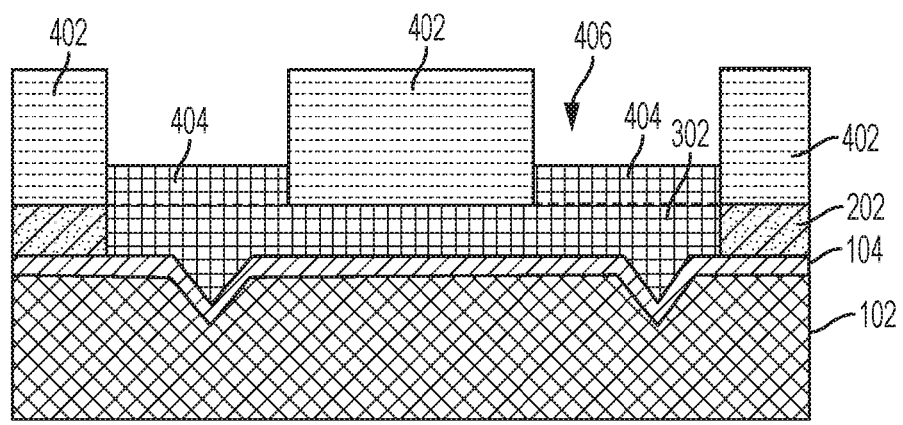

FIG. 4 illustrates a side view following the formation of a second mask 402 over portions of the first mask 202 and the conductive material 302. The second mask 402 may be formed by, for example, a suitable lithographic patterning and etching process. Following the formation of the second mask 402, a second layer of conductive material 404 may be formed over exposed portions of the conductive material 302. The second layer of conductive material 404 may include a similar or dissimilar material as the conductive material 302. The second layer of conductive material 404 is optional and may, in some exemplary embodiments be omitted. Collectively, the conductive material 302 and the optional second layer of conductive material 404 define a coil (winding) member 406.

Figure 5:
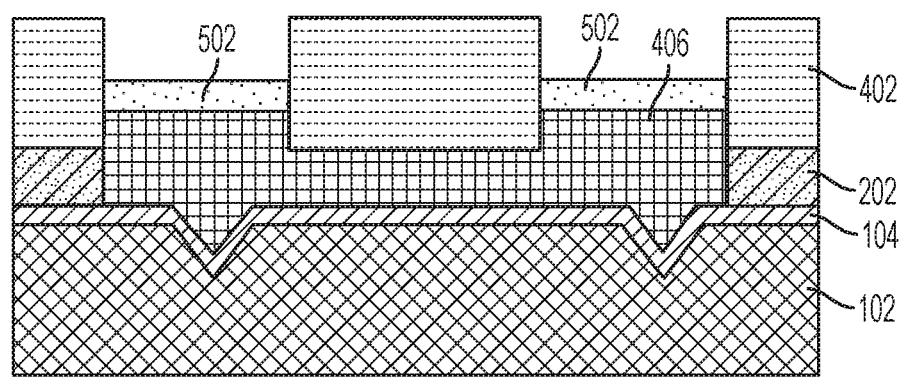

FIG. 5 illustrates a side view following the formation of a third layer of conductive material 502 over exposed portions of the coil member 406. In the illustrated embodiment, the third layer of conductive material 502 includes nickel that may be deposited by a suitable deposition process such as, for example, a spin-on, physical or chemical vapor deposition, atomic layer deposition, or plating process. The conductive material 502 is operative to react with the solder material, which reduces or slows reactions between the solder material and the coil material. The conductive material 502 may include a nickel material or a suitable alloy such as, NiFe or NiAu. Though the illustrated embodiment includes a third layer of conductive material 502, the third layer of conductive material is optional and may be omitted in alternate exemplary embodiments.

Figure 6:
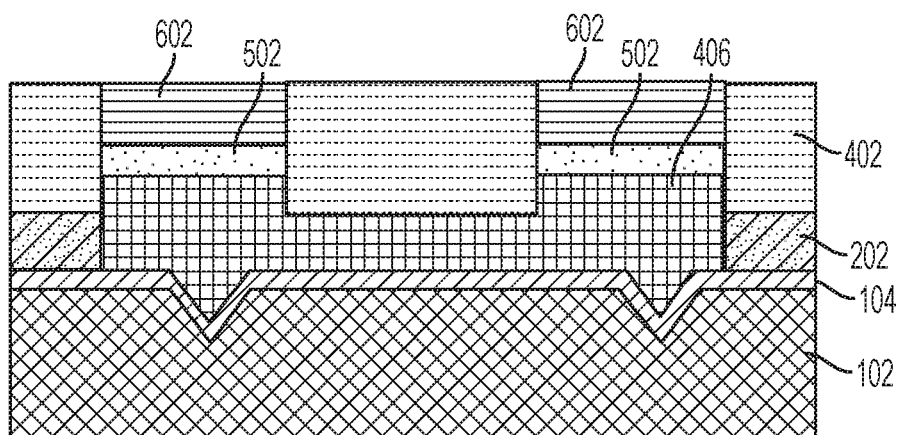

FIG. 6 illustrates a side view of the resultant structure following the deposition of a solder material 602 on exposed portions of the third layer of conductive material 502. The material 502 can be dispensed, spun on, transferred, injected, deposited by plating, physical or chemical vapor deposition, or atomic layer deposition. Once example of a solder deposition process includes electro-plating of Sn based solder using electro-deposition methods.

Figure 7:
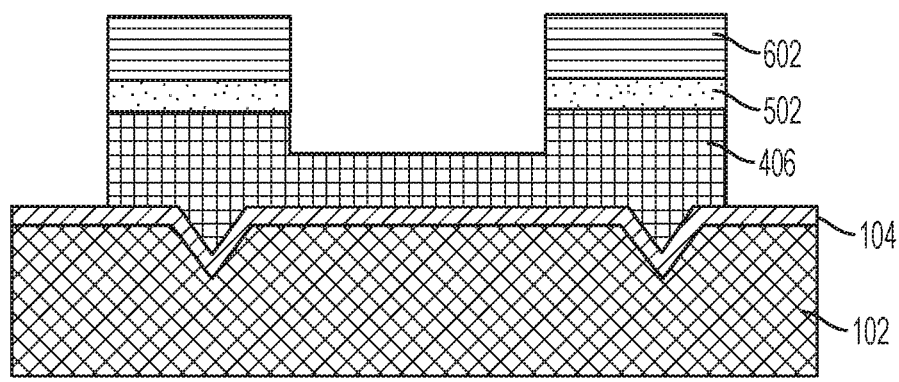

FIG. 7 illustrates a side view following the removal of the first mask 202 and the second mask 402 (of FIG. 6). The first mask 202 and the second mask 402 may be removed by a suitable process such as, for example, an ashing process. The ashing process may be used to remove a photoresist material, amorphous carbon, or organic planarization (OPL) layer. Ashing is performed using a suitable reaction gas, for example, $O_2$, $N_2$, H2/N2, $O_3$, $CF_4$, or any combination thereof.

Figure 8:
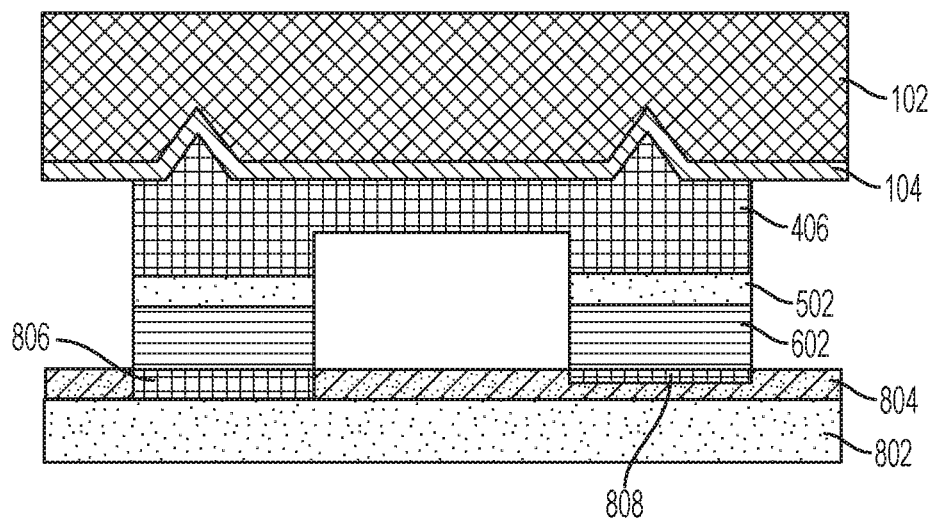

FIG. 8 illustrates a side view following a bonding process that bonds the solder material 602 to a semiconductor substrate (wafer) 802. In the illustrated exemplary embodiment, a dielectric layer 804 may be arranged on the wafer 802. A conductive contact portion 806 is arranged on the wafer 802. Support pads 808 are also arranged on the wafer 802. The conductive contact portion 806 and support pads 808 may include any suitable conductive material such as, for example, copper, aluminum, nickel, silver, or gold that may be formed by any suitable deposition process such, as for example, atomic layer deposition, spin-on, or plating processes.

Non-limiting examples of suitable materials for the semiconductor wafer 802 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials may include at least one "III element," such as aluminum (Al), boron (B), gallium (Ga), indium (In), and at least one "V element," such as nitrogen (N), phosphorous (P), arsenic (As), antimony (Sb).

The dielectric layer 804 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The dielectric layer 804 is deposited by a deposition process, including, but not limited to chemical vapor deposition (CVD), PVD, plasma enhanced CVD, atomic layer deposition (ALD), evaporation, chemical solution deposition, or like processes. Following the deposition of the dielectric layer 804, a planarization process such as, for example, chemical mechanical polishing is performed.

The solder material 602 may be bonded to the wafer 802 using any suitable bonding process such as, for example, wafer to wafer bonding, flip-chip bonding, pick and place, solder reflow, or cold-welding.

Figure 9:
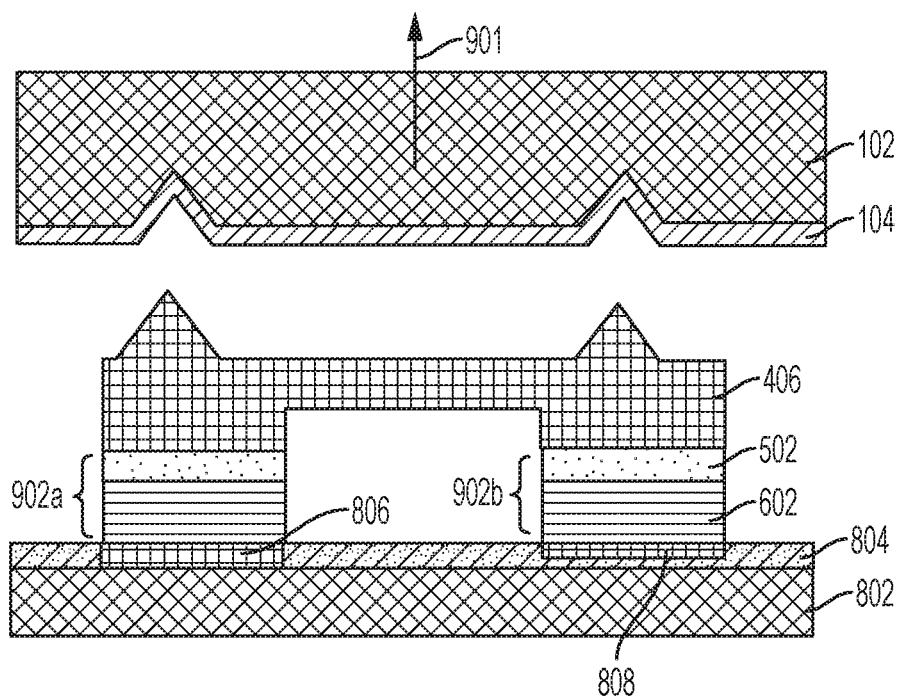

FIG. 9 illustrates a side view following the removal of the handle wafer 102 and the release layer 104 from the coil member 406. The handle wafer 102 may be removed from the coil member 406 by applying a force along the line 901. Since the release layer 104 is a low adhesion surface, the coil member 406 is releasable from the release layer 104 without using a force that will damage the coil member 406 or the underlying support structure below the coil member 406.

In the illustrated exemplary embodiment, the coil member 406 is supported above the wafer 802 by support members 902a and 902b that in the illustrated exemplary embodiment, include the third layer of conductive material 502 and the solder material 602. The support members 902a that are arranged on the conductive contact portion 806 provide a conductive path between the conductive contact portion 806 and the coil member 406. The support members 902a and 902b that are arranged on the support pads 808 provide mechanical support for the coil member 406 on the wafer 802.

Figure 10:
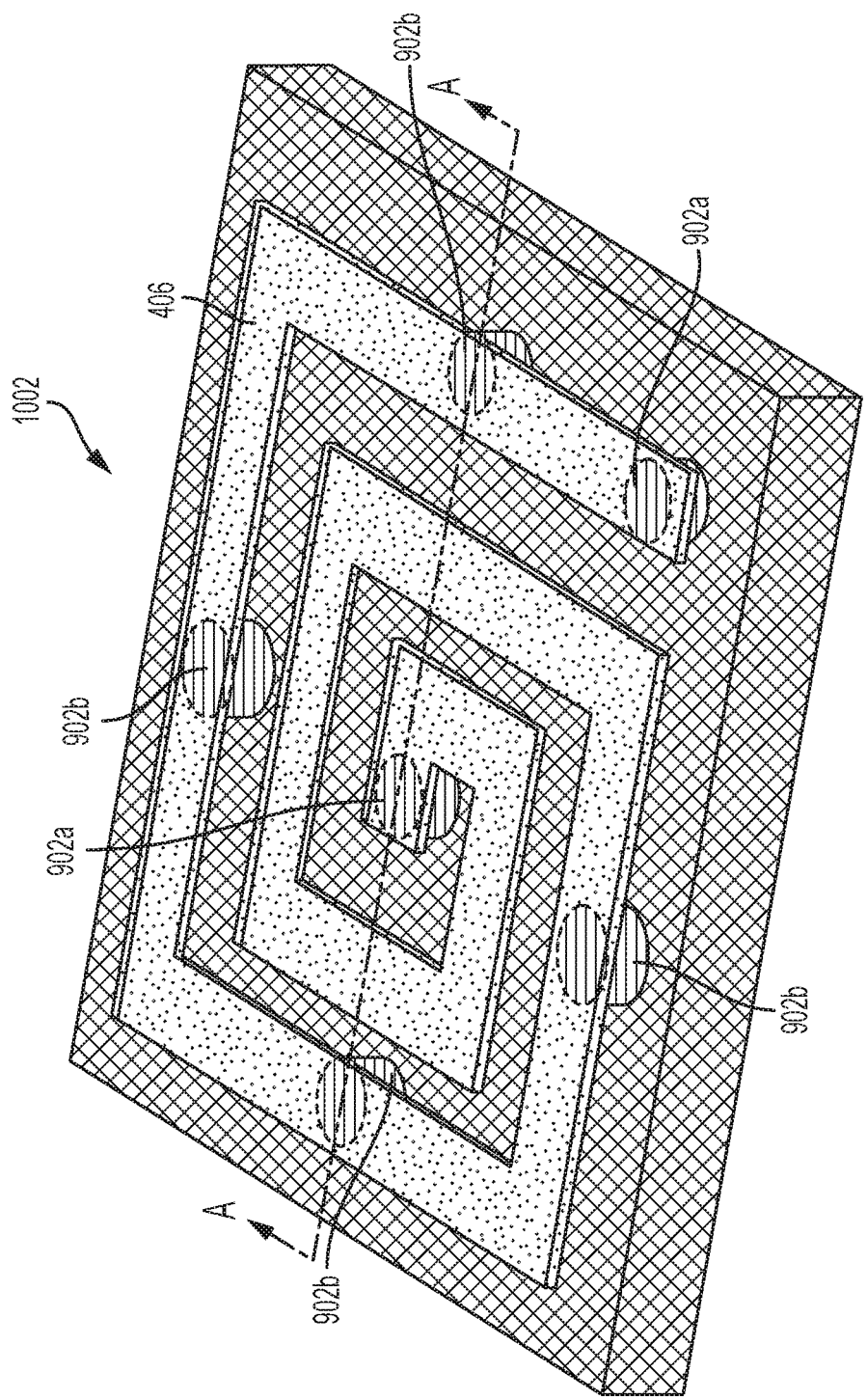

FIG. 10 illustrates a perspective view of the resultant structure following the removal of the handle wafer 102 as described above. The resultant structure includes the coil member 406 arranged on support members 902a and 902b over the wafer 802. In the illustrated exemplary embodiment, the coil member 406 is patterned in a spiral coil shape that defines an inductor 1002.

Figure 11:
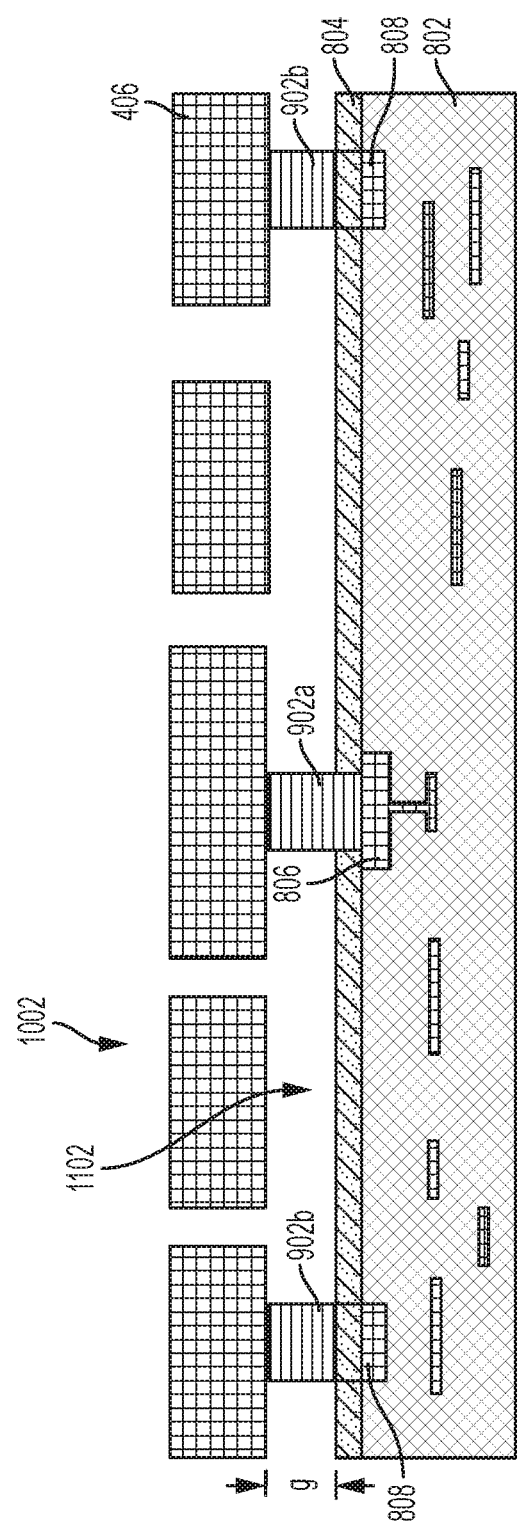

FIG. 11 illustrates a cut-away view along the line A-A (of FIG. 10) of the inductor 1002. The inductor 1002 and the wafer 802 define an airgap 1102 therebetween. The inductor 1002 and the wafer 802 (or in some embodiments the dielectric layer 804 arranged on the wafer) are spaced a distance g from each other. The distance g is partially defined by a height of the support members 902a and 902b.

Figure 12:
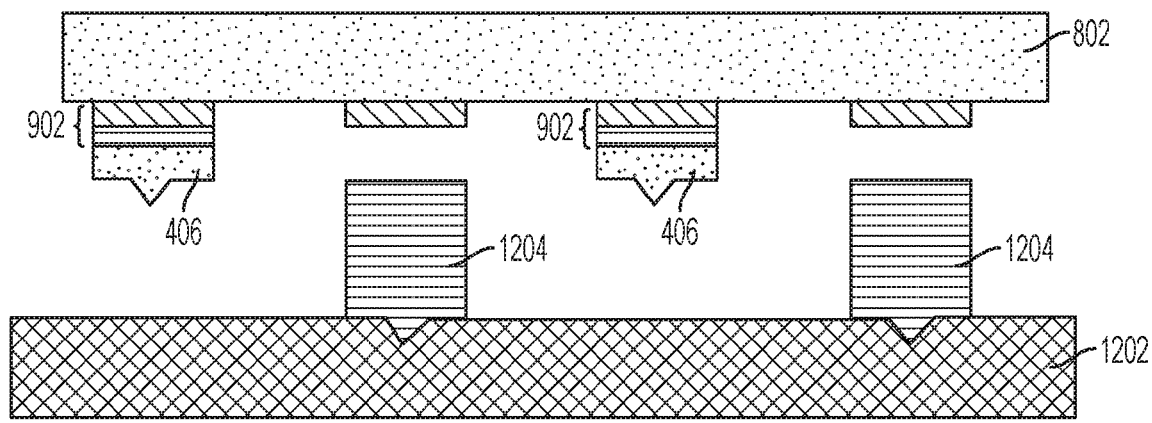
FIGS. 12-14 illustrate another method for fabricating a transformer or inductor device.
Figure 13:
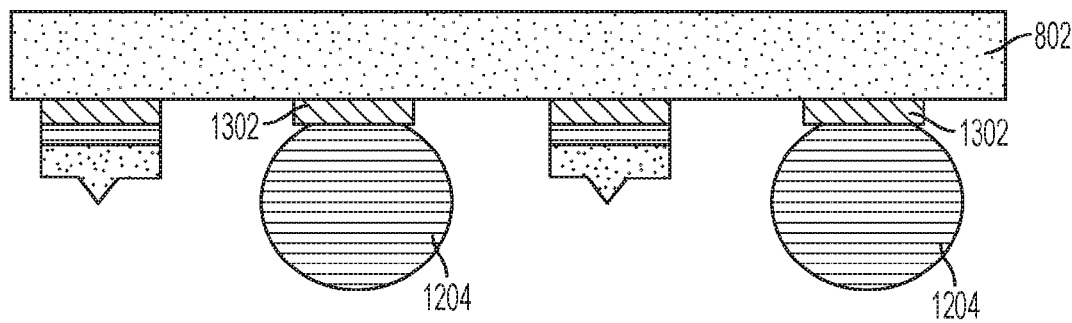
Figure 14:
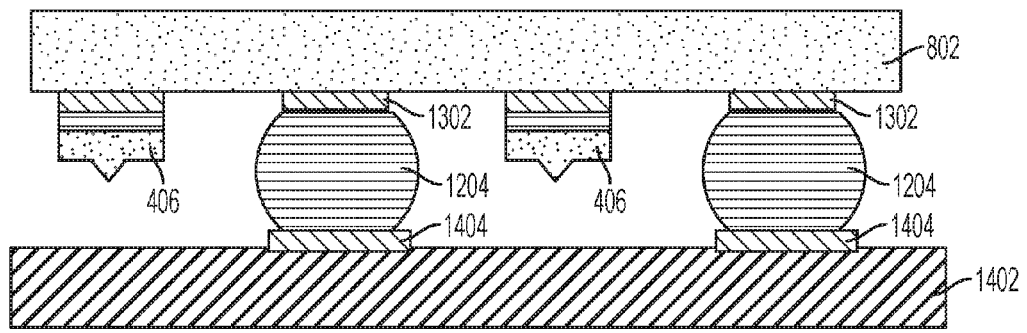

FIGS. 12-14 illustrate another method for fabricating a transformer or inductor device.

FIG. 12 illustrates a cut-away view of a portion of a coil member 406 arranged on support members 902 on a wafer 802. The coil member 406 and the support members 902 may be formed by a similar method as described above. In the illustrated exemplary embodiment, a second handle substrate 1202 has solder 1204 arranged thereon.

FIG. 13 illustrates a cut-away view following a suitable solder transfer process is used to transfer the solder 1204 from the second handle substrate 1202 (of FIG. 12) to the wafer 802. Conductive pads 1302 may be arranged on the wafer 802 to receive the solder 1204.

FIG. 14 illustrates a cut-away view following a suitable bonding process that bonds the wafer 802 to a second substrate 1402 via the solder 1204. The solder 1204 may be arranged to contact conductive pads 1404 arranged on the second substrate 1402.

FIGS. 15-18 illustrate another method for fabricating a transformer or inductor device.

Figure 15:
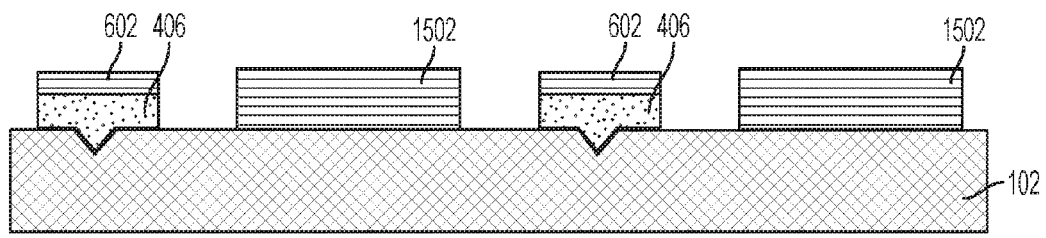
FIGS. 15-18 illustrate another method for fabricating a transformer or inductor device.

FIG. 15 illustrates a cut-away view of a handle wafer 102 that has a coil member 406 and solder material 602 formed on the handle wafer 102 using a similar method as described above in FIGS. 1-7. In the illustrated exemplary embodiment, solder 1502 is formed on the handle wafer 102.

Figure 16:
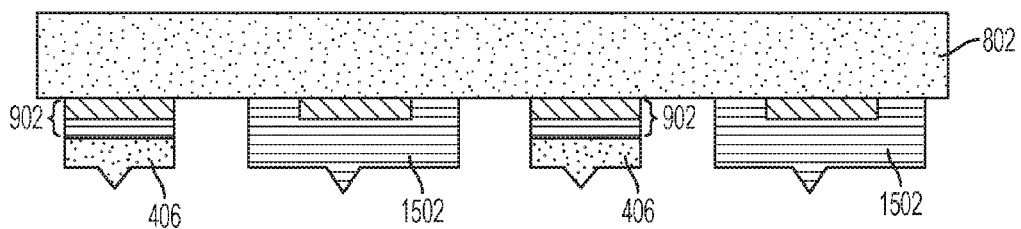

FIG. 16 illustrates a cut-away view following the transfer of the coil member 406, the solder material 602, and the solder 1502 to the wafer 802. The coil member 406 is arranged on the support members 902 arranged on the wafer 802.

Figure 17:
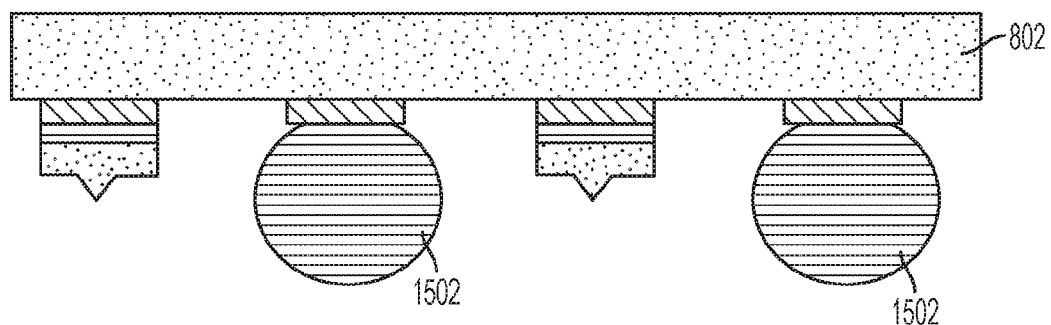

FIG. 17 illustrates a cut-away view following a thermal process that reflows the solder 1502. This process is optional and may be omitted in alternate exemplary embodiments.

Figure 18:
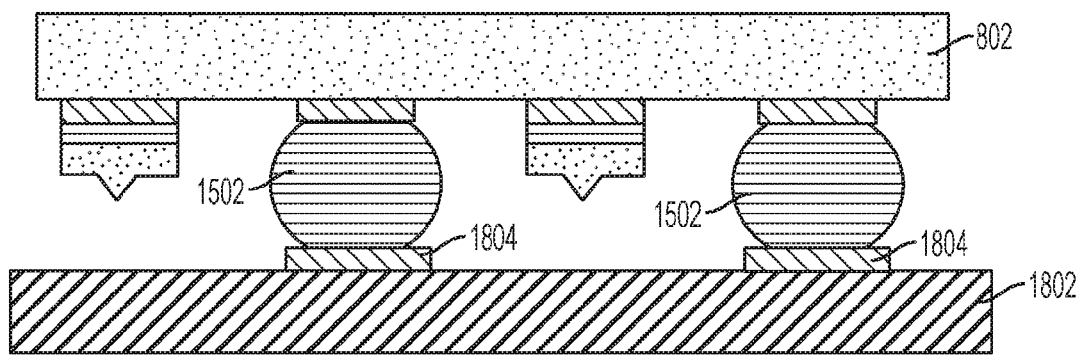

FIG. 18 illustrates a cut-away view following a suitable bonding process that bonds the wafer 802 to a second substrate 1802 via the solder 1502. The solder 1502 may be arranged to contact conductive pads 1804 arranged on the second substrate 1802.

Figure 19:
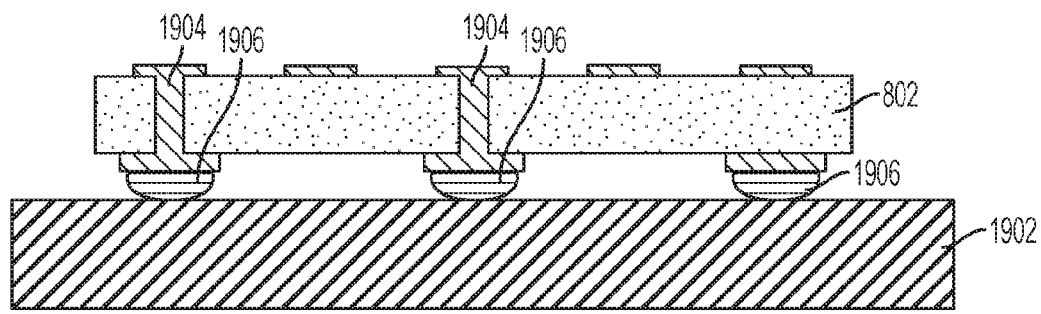
FIGS. 19-21 illustrate another method for fabricating a transformer or inductor device.
Figure 20:
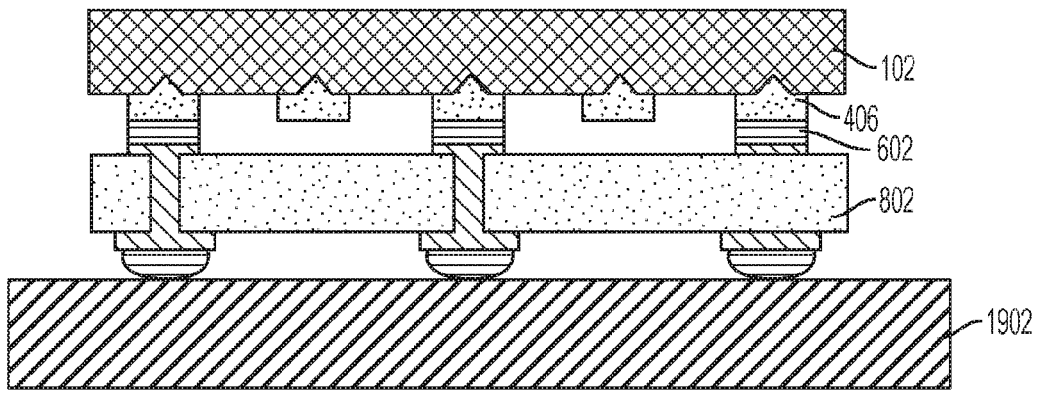
Figure 21:
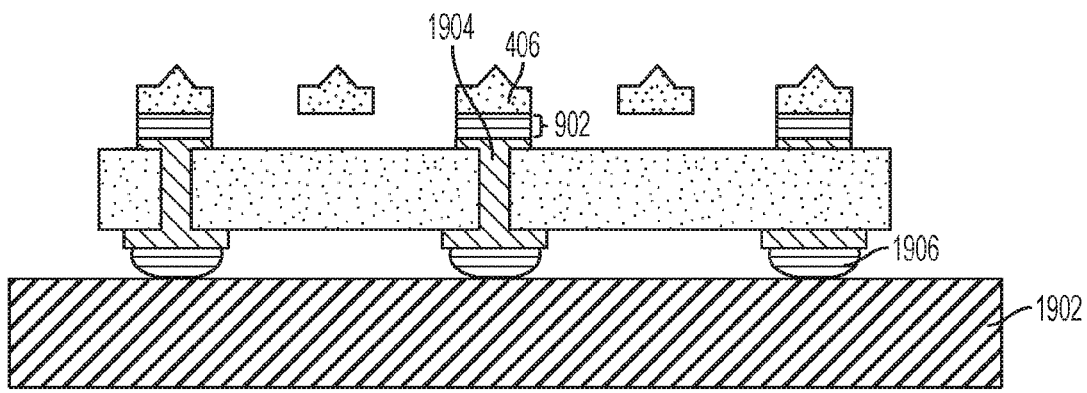

FIGS. 19-21 illustrate another method for fabricating a transformer or inductor device.

FIG. 19 illustrates a cut-away view of a second substrate 1902 and a wafer 802 arranged on the second substrate 1902. The wafer 802 is bonded to the second substrate 1902 with solder 1906.

FIG. 20 illustrates a cut-away view of the handle wafer 102 with the coil 406 arranged on the handle wafer 102. The coil 406 is formed on the handle wafer 102 using a similar process as described above in FIGS. 1-7.

FIG. 21 illustrates a cut-away view following the removal of the handle wafer 102 (of FIG. 20).

Figure 22:
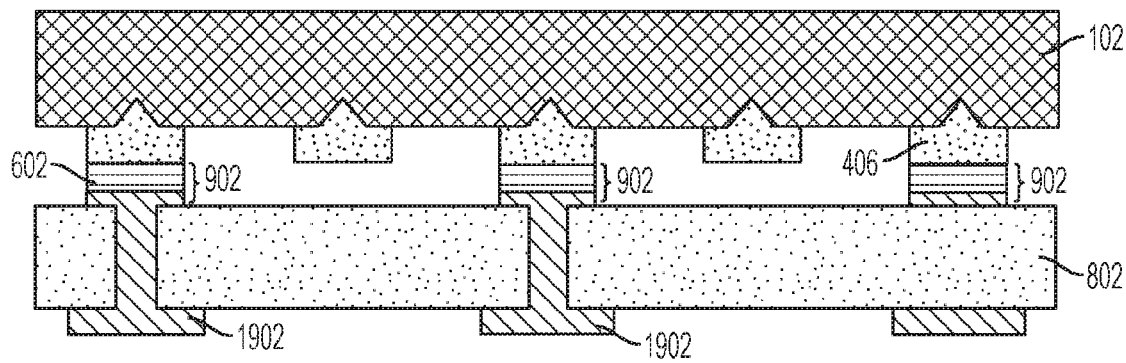
FIGS. 22-24 illustrate another method for fabricating a transformer or inductor device.
Figure 23:
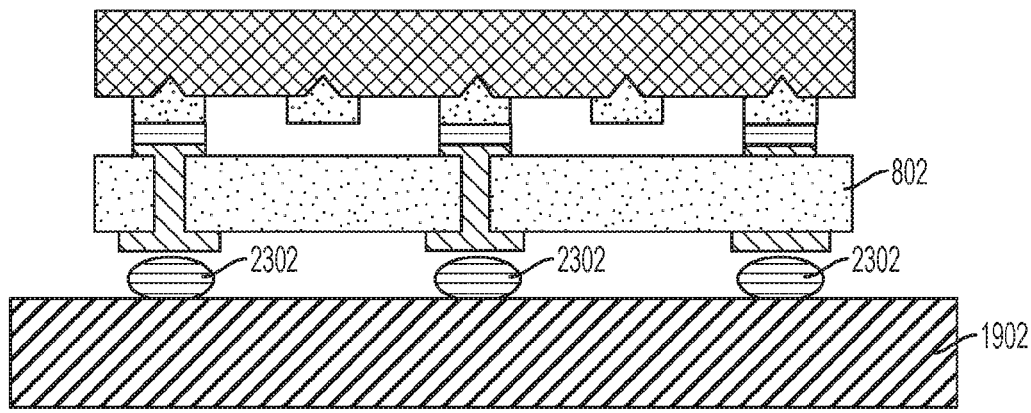
Figure 24:
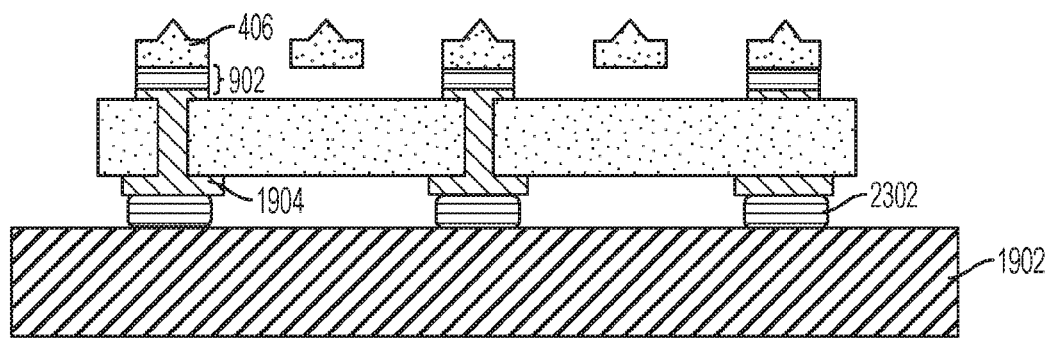

FIGS. 22-24 illustrate another method for fabricating a transformer or inductor device.

FIG. 22 illustrates a cut-away view of the wafer 802 that includes conductive vias 1904 that pass through cavities in the wafer 802. The coil 406 is formed on the handle wafer 102 using a similar method as described above in FIGS. 1-7. In the illustrated embodiment, the solder 602 on the coil 406 is used to bond the coil 406 to the wafer 802.

FIG. 23 illustrates a cut-away view prior to bonding the wafer 802 to the second substrate 1902 using solder 2302 that is arranged on the second substrate 1902.

FIG. 24 illustrates a cut-away view following the bonding of the wafer 802 to the substrate 1902. Once the wafer 802 is bonded to the second substrate 1902, the handle wafer 102 (of FIG. 23) is removed. The resultant structure includes the wafer 802 bonded to the second substrate 1902. Vias 1904 arranged in the wafer 802, and support members 902 arranged on the vias 1904 with the coil 406 arranged on the support members 902.

FIGS. 25-28 illustrate a method for fabricating a transformer or inductor device with a heat sink member.

Figure 25:
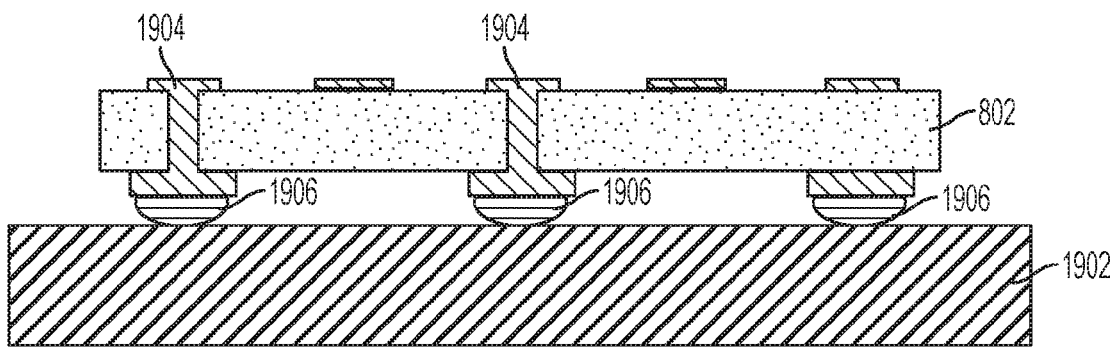
FIGS. 25-28 illustrate a method for fabricating a transformer or inductor device with a heat sink member.

FIG. 25 illustrates a cut-away view of a second substrate 1902 and a wafer 802 arranged on the second substrate 1902. The wafer 802 is bonded to the second substrate 1902 with solder 1906.

Figure 26:
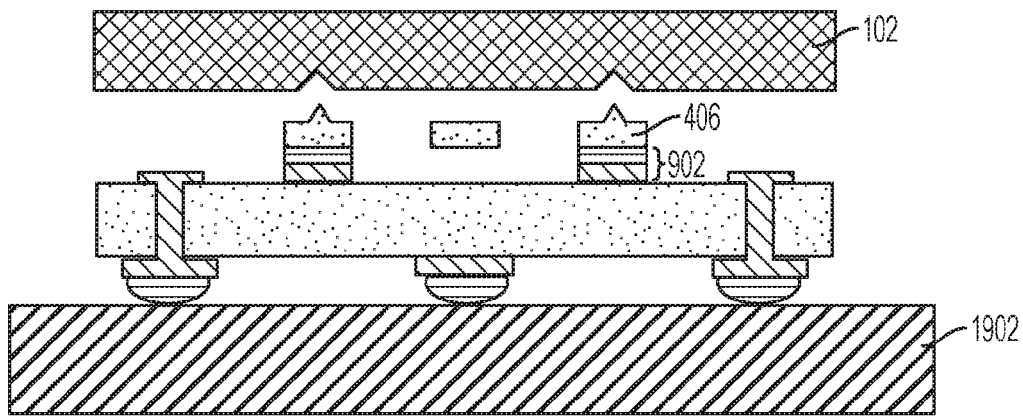

FIG. 26 illustrates a cut-away view of the wafer 802 with the coil 406 arranged on the wafer 802. The coil 406 is formed on the handle wafer 102 using a similar method as described above in FIGS. 1-7. FIG. 26 shows the handle wafer 102 after the handle wafer 102 has been released from the coil 406.

Figure 27:
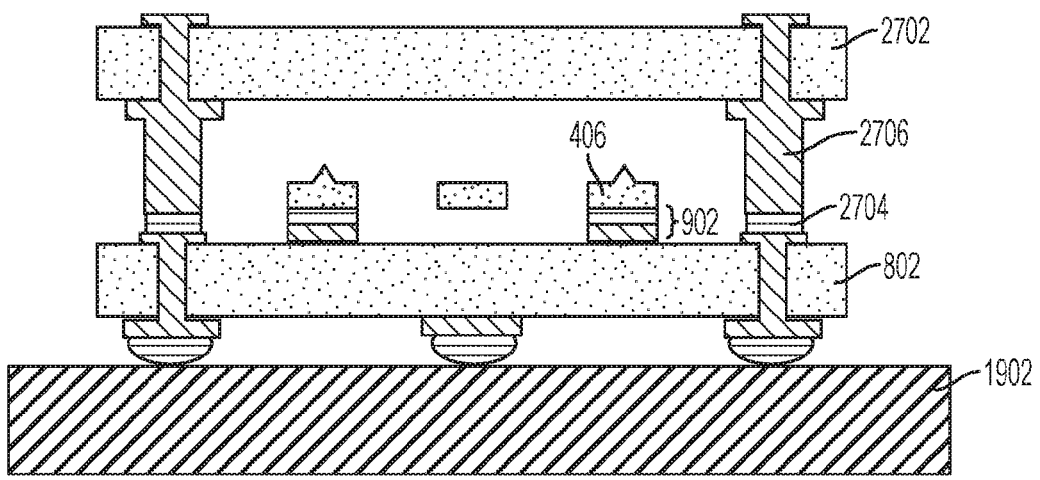

FIG. 27 illustrates a cut-away view of the wafer 802 with the coil 406 arranged on the wafer 802 and a second wafer 2702 arranged on the wafer 802. The second wafer 2702 is bonded to the wafer 802 with solder 2704 and is suspended above the coil 406 by posts 2706 that pass through the second wafer 2702.

Figure 28:
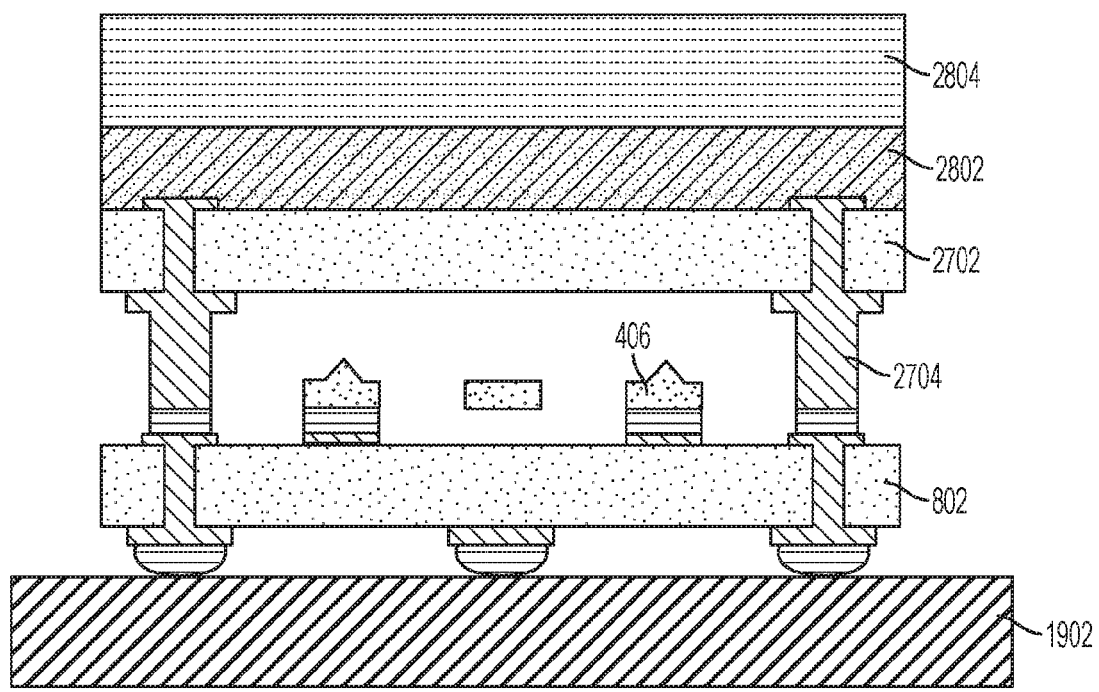

FIG. 28 illustrates a cut-away view of the second substrate 1902, the wafer 802 arranged on the second substrate 1902, the coil 406 arranged on the wafer 802, and the second wafer 2702 arranged on the wafer 802. Following the bonding of the second wafer 2702 to the first wafer 802, an optional thermal interface material 2802 is formed on the second wafer 2702. A heatsink 2804 is formed on the thermal interface material 2802.

FIGS. 29-32 illustrate another method for fabricating a transformer or inductor device with a heat sink member.

Figure 29:
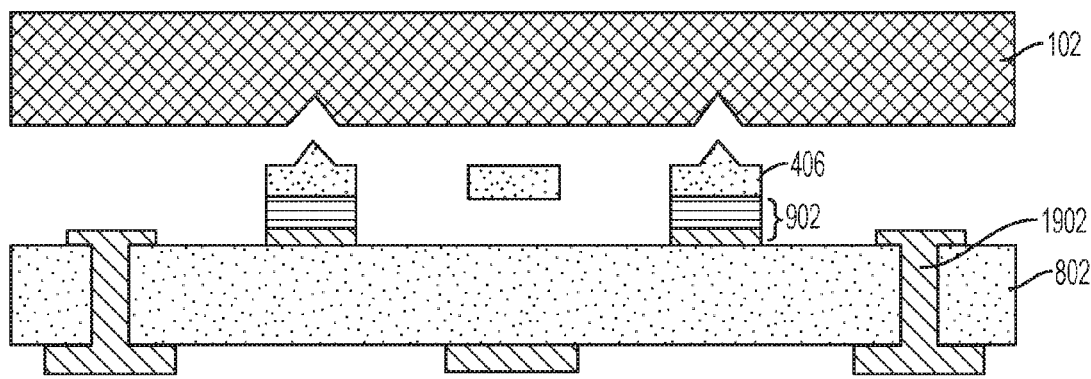
FIGS. 29-32 illustrate another method for fabricating a transformer or inductor device with a heat sink member.

FIG. 29 illustrates a cut-away view of the wafer 802 with the coil 406 arranged on the wafer 802. The coil 406 is formed on the handle wafer 102 using a similar method as described above in FIGS. 1-7. Vias 1902 are arranged on the wafer 802 and pass through the wafer 802. FIG. 29 shows the handle wafer 102 after the handle wafer 102 has been released from the coil 406.

Figure 30:
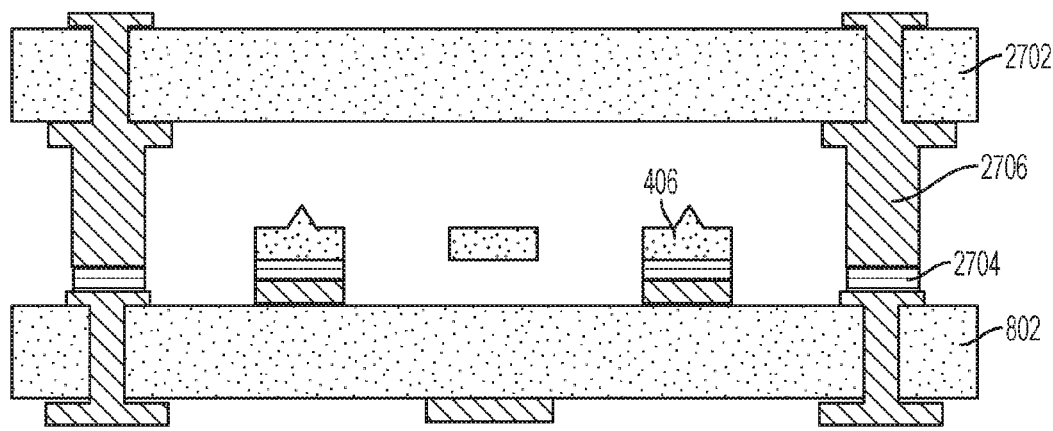

FIG. 30 illustrates a cut-away view of the wafer 802 with the coil 406 arranged on the wafer 802 and a second wafer 2702 arranged on the wafer 802. The second wafer 2702 is bonded to the wafer 802 with solder 2704 and is suspended above the coil 406 by posts 2706 that pass through the second wafer 2702.

Figure 31:
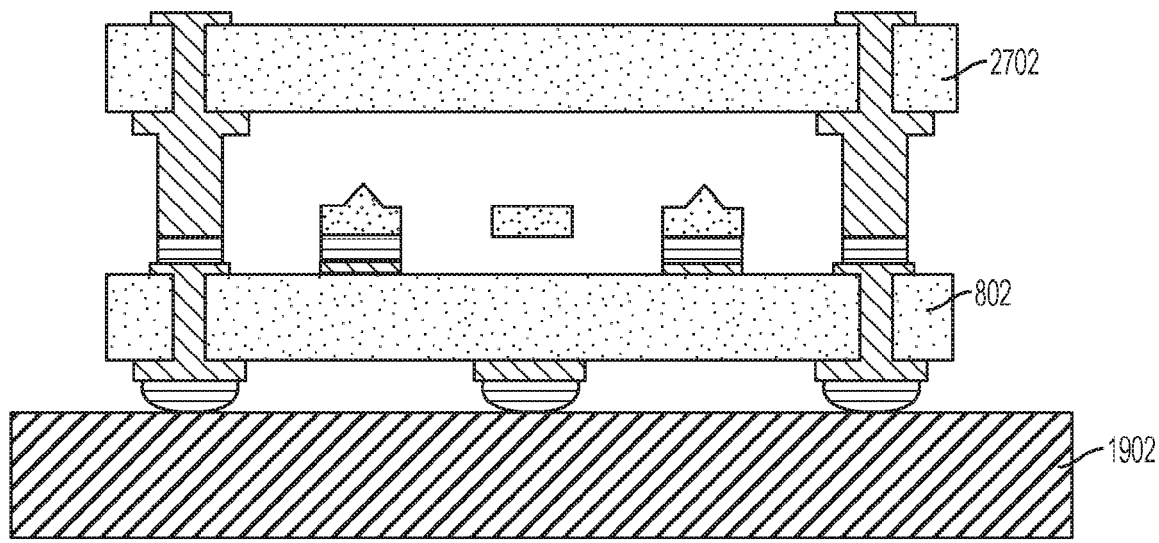

FIG. 31 illustrates a cut-away view after the wafer 802 is bonded to the second substrate 1902.

Figure 32:
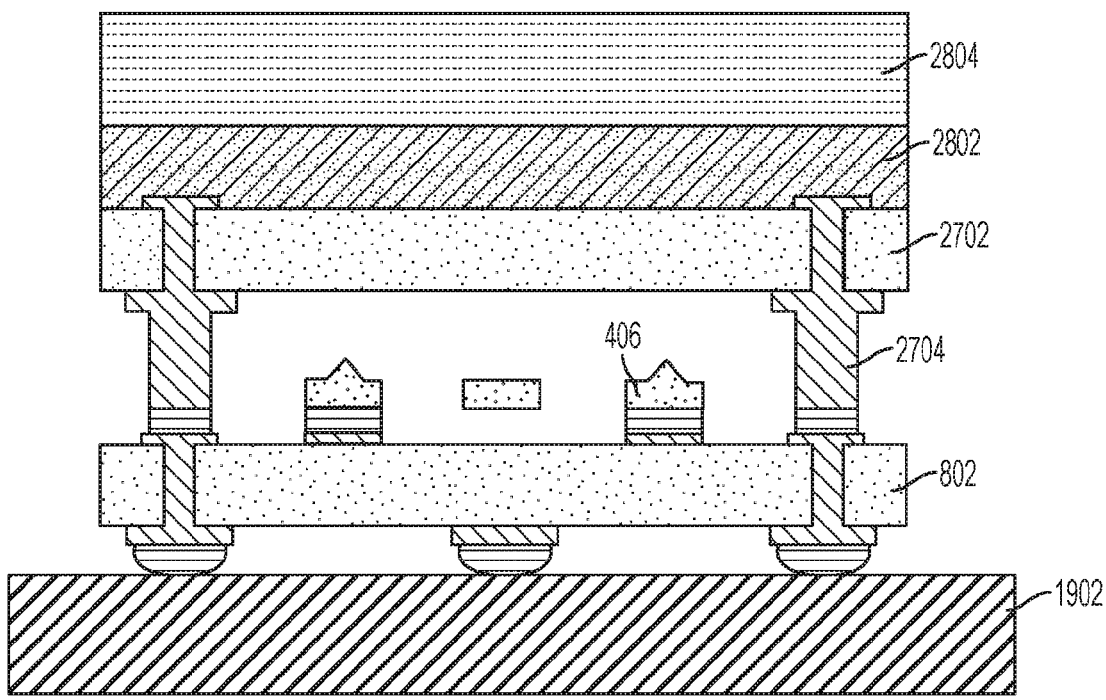

FIG. 32 illustrates a cut-away view of the second substrate 1902, the wafer 802 arranged on the second substrate 1902, the coil 406 arranged on the wafer 802, and the second wafer 2702 arranged on the wafer 802. Following the bonding of the wafer 802 to the second substrate 1902, an optional thermal interface material 2802 is formed on the second wafer 2702. A heatsink 2804 is formed on the thermal interface material 2802.

Figure 33:
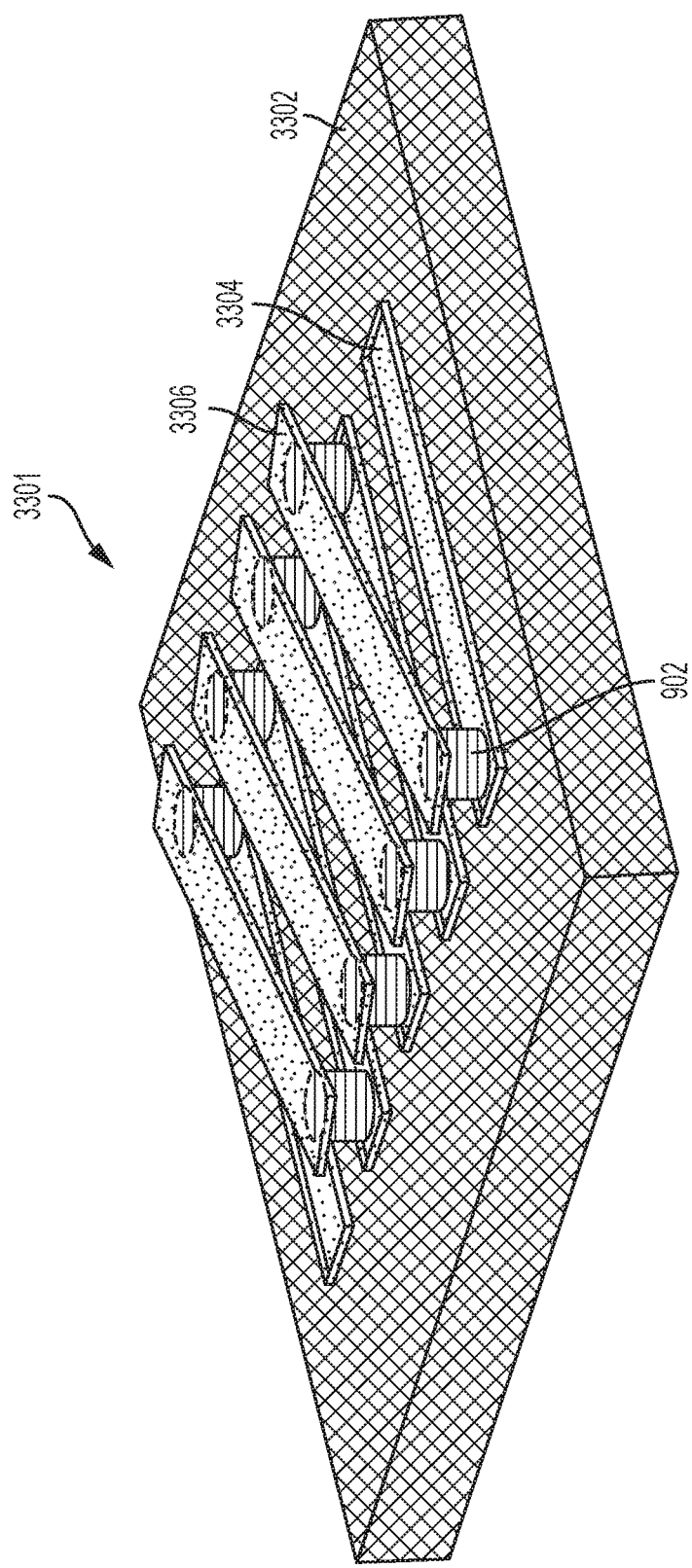
FIG. 33 illustrates a perspective view of an exemplary embodiment of a solenoid inductor that is arranged on a substrate.

FIG. 33 illustrates a perspective view of an exemplary embodiment of a solenoid inductor 3301 that is arranged on a substrate 3302. The solenoid inductor 3301 includes coil members 3304 arranged on the substrate 3302 and coil members 3306 arranged on support members 902 that are electrically connected to the coil members 3304. In this regard, the coil members 3304 are electrically connected to the coil members 3306 via the support members 902. The coil members 3306 and support members 902 are formed using a similar fabrication process as the process described above in FIGS. 1-7.

The methods described herein provide for any number of coil members to be stacked vertically to form multi-turn inductor and transformer elements.

Figure 34:
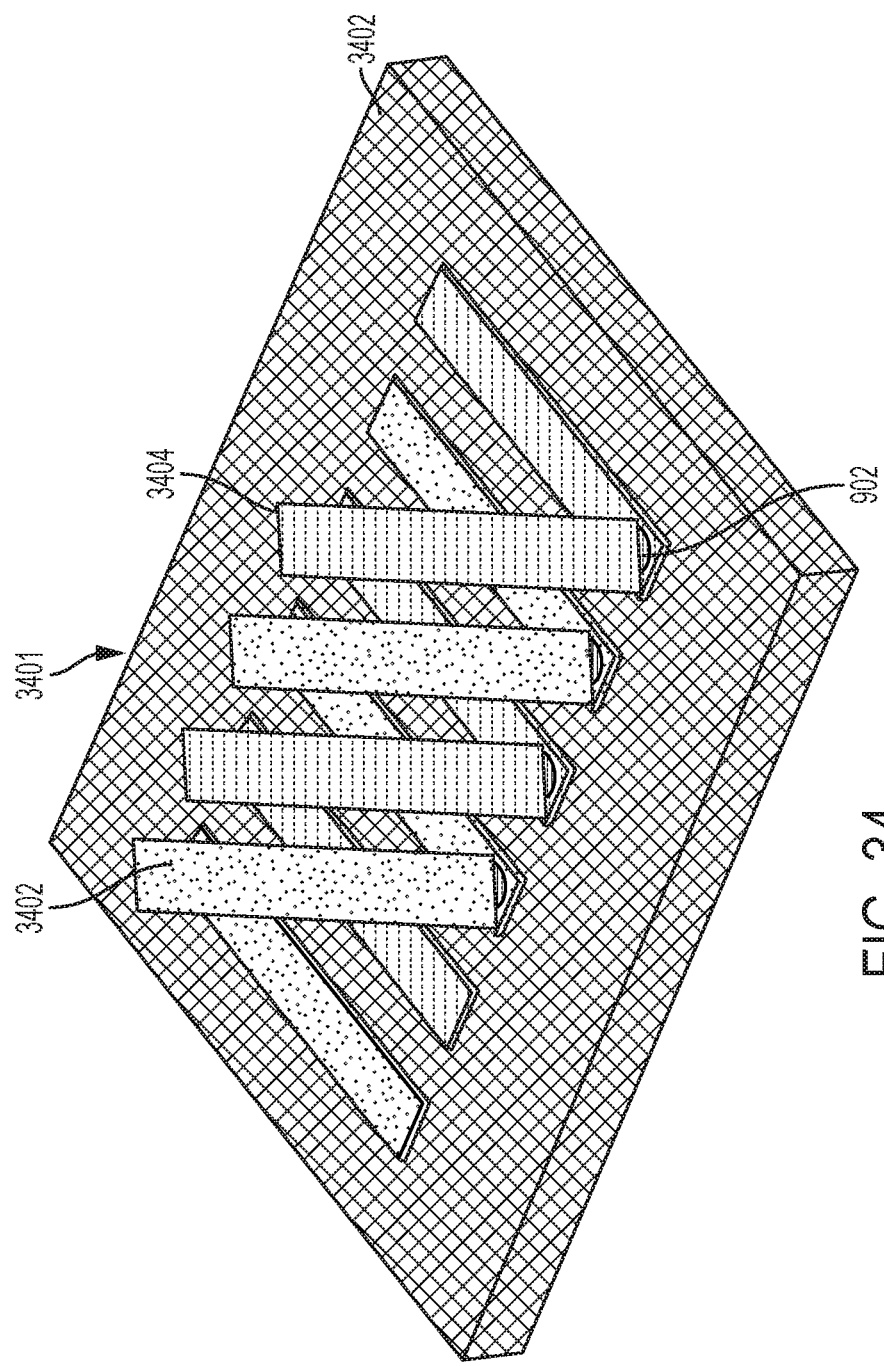
FIG. 34 illustrates a perspective view of an exemplary embodiment of a transformer (or coupled inductor) arranged on a substrate.

FIG. 34 illustrates a perspective view of an exemplary embodiment of a transformer (or coupled inductor) 3401 arranged on a substrate 3402. The transformer 3401 includes a first coil portion 3402 interleaved with a second coil portion 3404. The first coil portion 3402 and the second coil portion 3404 include coil members 3406 arranged on the substrate 3402 and coil members 3408 arranged on support members 902. The support members 902 provide an electrical connection between the coil members 3406 and 3408. The coil member 3408 and the support members 902 are formed using a similar fabrication process as the process described above in FIGS. 1-7.

Figure 35:
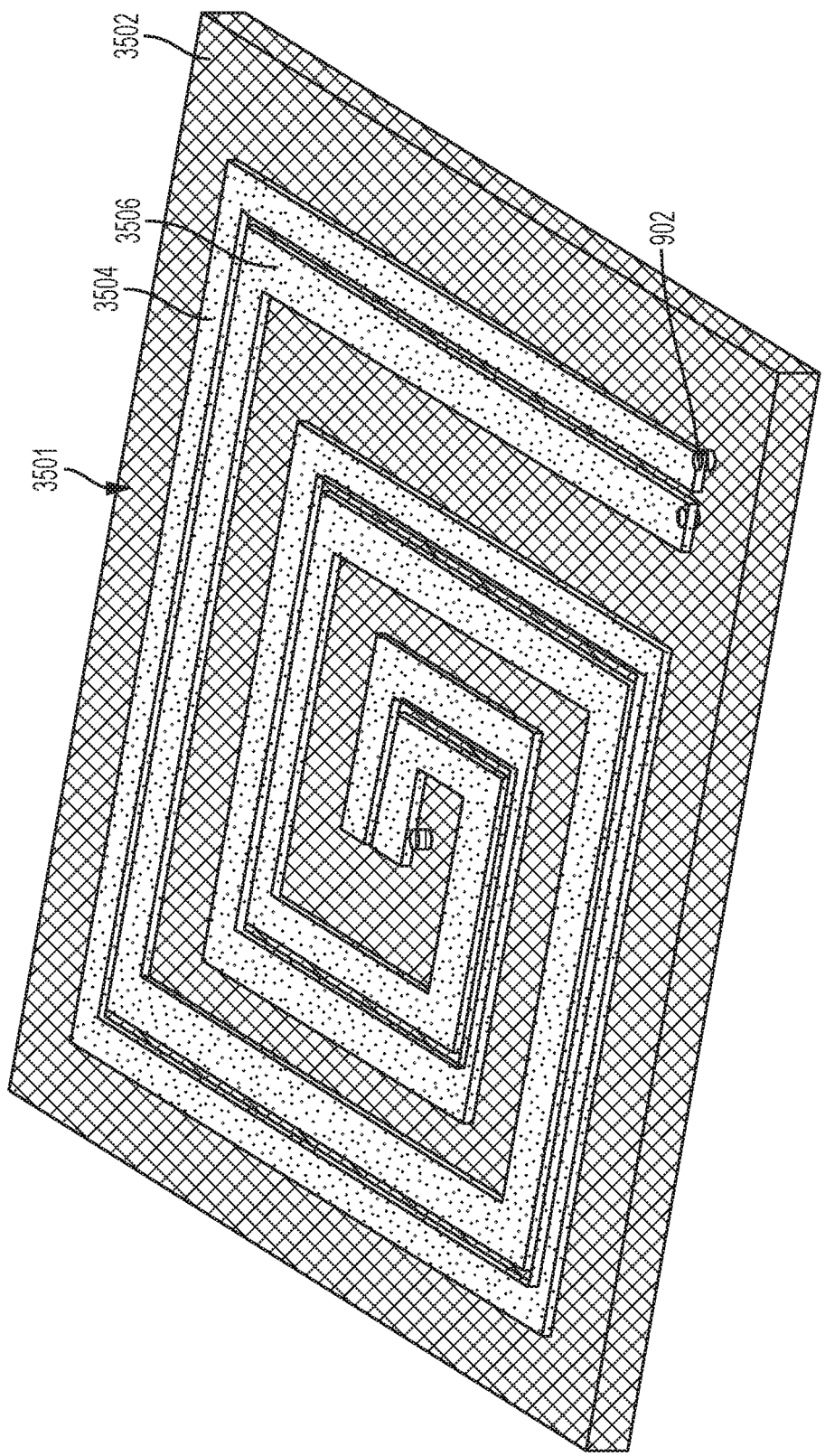
FIG. 35 illustrates a perspective view of an inductor arranged on a substrate.

FIG. 35 illustrates a perspective view of an inductor 3501 arranged on a substrate 3502. The inductor 3501 includes a first coil portion 3504 and a second coil portion 3506 that are supported by support members 902. In the illustrated exemplary embodiment, the first coil portion 3504 and the second coil portion 3506 are substantially coplanar and concentric.

The methods and resultant structures described above provide for air core inductors and transformers arranged on a substrate with an air gap between the conductive coils and an underlying substrate. The methods may be used to form a variety of conductive elements arranged on and supported by support members on a substrate.

As used herein, the terms "invention" or "present invention" are non-limiting terms and not intended to refer to any single aspect of the particular invention but encompass all possible aspects as described in the specification and the claims. The term "on" may refer to an element that is on, above or in contact with another element or feature described in the specification and/or illustrated in the figures.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" "on and in direct contact with" another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a coil, the method comprising:
   patterning a first mask on a handle wafer, such that the first mask is not in direct contact with the handle wafer;
   depositing a conductive material on exposed portions of the handle wafer to partially define the coil, wherein sides of the conductive material are in contact with the first mask;
   patterning a second mask on portions of the first mask and the conductive material;
   depositing a solder material on a portion of the conductive material to partially define a support member;
   bonding the solder material to a wafer; and
   separating the handle wafer from the conductive material.

2. The method of claim 1, further comprising depositing a release layer on the handle wafer prior to depositing the conductive material.

3. The method of claim 1, further comprising depositing the release layer on the handle wafer prior to patterning the first mask on the handle wafer.

4. The method of claim 1, further comprising forming a plurality of cavities in the handle wafer prior to depositing the conductive material.

5. A method for forming a coil, the method comprising:
   patterning a first mask on a handle wafer;
   depositing a conductive material on exposed portions of the handle wafer to partially define the coil, wherein a release layer is deposited on the handle wafer prior to depositing the conductive material;
   patterning a second mask on portions of the first ask and the conductive material;
   depositing a solder material on a ion of the conductive material to partially define a support member;
   bonding the solder material to a wafer;
   separating the handle wafer from the conductive material;
   forming a plurality of cavities in the handle wafer prior to depositing the release layer.

6. The method of claim 1, further comprising depositing a layer of conductive material on the conductive material after patterning the second mask and prior to depositing the solder material such that the solder material is arranged on the layer of conductive material.

7. The method of claim 1, further comprising forming a conductive contact on the wafer and arranging the solder material on the conductive contact when bonding the solder material to the wafer.

8. The method of claim 1, further comprising depositing a second layer of conductive material on the conductive material after patterning the second mask and prior to depositing the solder material.

9. The method of claim 1, further comprising:
   depositing solder material on a second handle wafer;
   transferring the solder material from the second handle wafer to the wafer after separating the handle wafer from the conductive material; and
   bonding the wafer to a substrate with the solder material.

10. A method for forming a coil, the method comprising:
    forming a release layer on a handle wafer;
    patterning a first mask on the handle wafer, such that the first mask is not in direct contact with the handle wafer;
    depositing a first layer of conductive material on exposed portions of the release layer to partially define the coil;
    patterning a second mask on portions of the first mask and the first layer of conductive material;
    forming a support member on the first layer of conductive material; and
    separating the handle wafer from the first layer of conductive material.

11. The method of claim 10, further comprising bonding the support member to a wafer prior to separating the handle wafer from the first layer of conductive material.

12. The method of claim 10, further comprising forming a plurality of cavities in the handle wafer prior to forming the release layer on the handle wafer.

13. The method of claim 10, wherein the forming the support member includes depositing a second layer of conductive material on the first layer of conductive material.

14. The method of claim 13, wherein forming the support member further includes depositing a solder material on the second layer of conductive material.

15. The method of claim 10, wherein the separating the handle wafer from the first layer of conductive material includes applying a force to the handle wafer.

16. The method of claim 10, further comprising:
    depositing solder material on a second handle wafer;
    transferring the solder material from the second handle wafer to the wafer after separating the handle wafer from the first layer of conductive material; and
    bonding the wafer to a substrate with the solder material.

17. The method of claim 11, further comprising:
    forming a conductive via through the wafer prior to bonding the support member to the wafer; and
    bonding the wafer to a substrate prior to separating the handle wafer from the first layer of conductive material.

* * * * *